United States Patent
Kim

(10) Patent No.: US 10,964,736 B2
(45) Date of Patent: Mar. 30, 2021

(54) IMAGE SENSING DEVICE AND METHOD FOR FORMING THE SAME

(71) Applicant: SK hynix Inc., Icheon-si (KR)

(72) Inventor: Byoung Gyu Kim, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/551,574

(22) Filed: Aug. 26, 2019

(65) Prior Publication Data
US 2020/0258922 A1    Aug. 13, 2020

(30) Foreign Application Priority Data

Feb. 13, 2019   (KR) .................. 10-2019-0016449

(51) Int. Cl.
| | | |
|---|---|---|
| *H01L 31/062* | (2012.01) | |
| *H01L 31/113* | (2006.01) | |
| *H01L 27/146* | (2006.01) | |

(52) U.S. Cl.
CPC ...... *H01L 27/1461* (2013.01); *H01L 27/1462* (2013.01); *H01L 27/1463* (2013.01); *H01L 27/14621* (2013.01); *H01L 27/14623* (2013.01); *H01L 27/14627* (2013.01); *H01L 27/14636* (2013.01); *H01L 27/14645* (2013.01); *H01L 27/14685* (2013.01); *H01L 27/14689* (2013.01)

(58) Field of Classification Search
CPC ......... H01L 27/14687; H01L 27/14607; H01L 27/14683
See application file for complete search history.

(56) References Cited

U.S. PATENT DOCUMENTS

| | | | | |
|---|---|---|---|---|
| 2011/0073923 A1* | 3/2011 | Tatani | ................ | H01L 27/1463 257/291 |
| 2013/0087875 A1* | 4/2013 | Kobayashi | ........ | H01L 27/14605 257/432 |
| 2013/0182158 A1* | 7/2013 | Kobayashi | ........ | H01L 27/14645 348/294 |
| 2014/0299746 A1* | 10/2014 | Iwata | ................ | H01L 27/14607 250/208.1 |
| 2019/0035827 A1* | 1/2019 | Kawabata | ......... | H01L 27/14689 |

FOREIGN PATENT DOCUMENTS

KR    10-2010-0078163    7/2010

* cited by examiner

*Primary Examiner* — Ismail A Muse
(74) *Attorney, Agent, or Firm* — Perkins Coie LLP

(57) ABSTRACT

An image sensing device is disclosed. The image sensing device includes a semiconductor substrate including an active region, a first impurity region and a second impurity region formed in the active region, a photoelectric conversion region disposed over the semiconductor substrate to be directly coupled to the first impurity region and configured to generate photocharges in response to incident light and transmit the generated photocharges to the first impurity region, a switching element disposed coupled to the first impurity region and the second impurity region and configured to transmit the photocharges stored in the first impurity region to the second impurity region, an insulation structure disposed on sides of the photoelectric conversion region and a plurality of conductive lines disposed in the insulation structure and configured to read out an electrical image signal corresponding to the photocharges generated by the photoelectric conversion region.

9 Claims, 11 Drawing Sheets

IMAGE SENSING DEVICE AND METHOD FOR FORMING THE SAME

CROSS-REFERENCE TO RELATED APPLICATION

This patent document claims the priority and benefits of Korean patent application No. 10-2019-0016449, filed on Feb. 13, 2019, which is hereby incorporated in its entirety by reference.

TECHNICAL FIELD

The technology and implementations disclosed in this patent document relate to an image sensing device.

BACKGROUND

An image sensing device is a semiconductor device for converting an optical image into electrical signals. Image sensing devices may be classified into CCD (Charge Coupled Device)-based image sensing devices and CMOS (Complementary Metal Oxide Semiconductor)-based image sensing devices.

In recent times, with the increasing development of CMOS image sensors, demand for high-quality and high-performance CMOS image sensors is rapidly increasing in various electronic appliances, for example, smartphones, digital cameras, etc. The CMOS image sensor includes a photoelectric conversion element to generate charges from incident light received from an external part, and one or more circuits to process electrical signals corresponding to the generated charges.

SUMMARY

Various embodiments of the disclosed technology relate to an image sensing device and a method for forming the image sensing device which can improve optical characteristics and crosstalk characteristics.

In accordance with an embodiment of the disclosed technology, an image sensing device may include a semiconductor substrate including an active region, a first impurity region and a second impurity region formed in the active region, a photoelectric conversion region disposed over the semiconductor substrate to be directly coupled to the first impurity region and configured to generate photocharges in response to incident and transmit the generated photocharges to the first impurity region, a switching element disposed coupled to the first impurity region and the second impurity region and configured to transmit the photocharges stored in the first impurity region to the second impurity region, an insulation structure disposed on sides of the photoelectric conversion region and a plurality of conductive lines disposed in the insulation structure and configured to read out an electrical image signal corresponding to the photocharges generated by the photoelectric conversion region.

In accordance with an embodiment of the disclosed technology, a method for forming an image sensing device may include forming a first impurity region and a second impurity region in a first substrate, forming a switching element over the first substrate to be coupled to the first impurity region and the second impurity region over the first substrate, forming an insulation structure over the first substrate to cover the switching element, forming a trench exposing the first impurity region by etching the insulation structure and placing a photoelectric conversion element in the trench to couple the photoelectric conversion element to the first impurity region, the photoelectric conversion element disposed in a second substrate different from the first substrate and having a shape corresponding to a shape of the trench.

It is to be understood that both the foregoing general description and the following detailed description of the present disclosure are illustrative and explanatory and are intended to provide further explanation of the disclosure as claimed.

BRIEF DESCRIPTION OF THE DRAWINGS

The above and other features and beneficial aspects of the present disclosure will become readily apparent with reference to the following detailed description when considered in conjunction with the accompanying drawings.

DETAILED DESCRIPTION

This patent document provides implementations and examples of image sensing devices and methods for forming an image sensing device. Some implementations of the disclosed technology suggest designs of an image sensing device and fabrication techniques for forming the image sensing device to enable to improve optical characteristics and crosstalk characteristics.

As resolution of the CMOS image sensor increases, the size of each pixel contained in the CMOS image sensor is gradually reduced to increase the number of pixels without increasing a chip size. Therefore, interference between the pixels, for example, crosstalk, may occur, which results in reducing the quality and accuracy of an image. In recognition of the issues above, the disclosed technology provides various implementations of an image sensing device and a method for forming the image sensing device, which can reduce or prevent the interference between the pixels and improve optical characteristics of an image.

Reference will now be made in detail to certain embodiments, examples of which are illustrated in the accompanying drawings. Wherever possible, the same reference numbers will be used throughout the drawings to refer to the same or similar parts.

Figure 1:
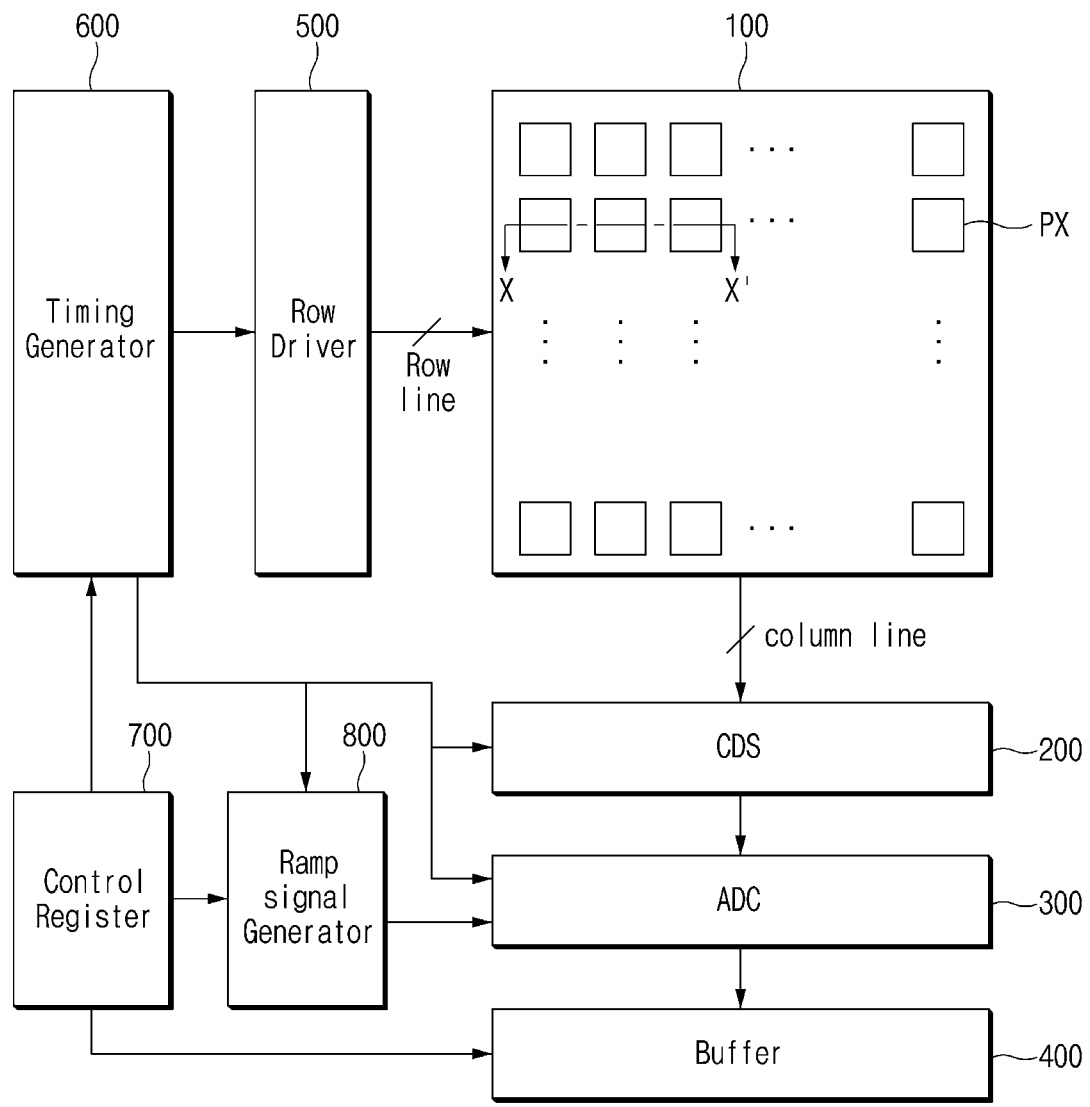
FIG. 1 is an example of a block diagram illustrating an image sensing device based on some implementations of the disclosed technology.

FIG. 1 is a block diagram illustrating an image sensing device based on some implementations of the disclosed technology.

Referring to FIG. 1, the image sensing device may include a pixel array 100, a correlated double sampler (CDS) 200, an analog-to-digital converter (ADC) 300, a buffer 400, a row driver 500, a timing generator 600, a control register 700, and a ramp signal generator 800.

The pixel array 100 may include a plurality of unit pixels (PXs) arranged in a matrix shape. Each of the unit pixels (PXs) may convert optical image information into an electrical image signal, and may output the electrical image signal to the correlated double sampler (CDS) 200 through column lines. Each of the unit pixels (PXs) may be coupled to any one of row lines and any one of column lines.

The correlated double sampler (CDS) 200 may hold and sample the electrical image signal received from the unit pixels (PXs) of the pixel array 100. For example, the correlated double sampler (CDS) 200 may perform sampling of a reference voltage level and a voltage level of the received electrical image signal in response to a clock signal received from the timing generator 600, and may transmit an analog signal corresponding to a difference between the reference voltage level and the voltage level of the received electrical image signal to the analog-to-digital converter (ADC) 300.

The analog-to-digital converter (ADC) 300 may compare a ramp signal received from the ramp signal generator 800 with a sampling signal received from the correlated double sampler (CDS) 200, and may thus output a comparison signal indicating the result of comparison between the ramp signal and the sampling signal. The analog-to-digital converter (ADC) 300 may count a level transition time of the comparison signal in response to a clock signal received from the timing generator 600, and may output a count value indicating the counted level transition time to the buffer 400.

The buffer 400 may store each of the digital signals received from the analog-to-digital converter (ADC) 300, may sense and amplify each of the digital signals, and may output each of the amplified digital signals. Therefore, the buffer 400 may include a memory (not shown) and a sense amplifier (not shown). The memory may store the count value, and the count value may be associated with output signals of the plurality of unit pixels (PXs). The sense amplifier may sense and amplify each count value received from the memory.

The row driver 500 may drive the pixel array 100 in units of a row line in response to an output signal of the timing generator 600. For example, the row driver 500 may generate a selection signal to select any one of the row lines. The selection signal may include a control signal to control on/off operations of a switching junction to be described later.

The timing generator 600 may generate a timing signal to control the row driver 500, the correlated double sampler (CDS) 200, the analog-to-digital converter (ADC) 300, and the ramp signal generator 800.

The control register 700 may generate control signals to control the ramp signal generator 800, the timing generator 600, and the buffer 400.

The ramp signal generator 800 may generate a ramp signal to control an image signal received from the buffer 400 in response to a control signal received from the timing generator 600.

Figure 2:
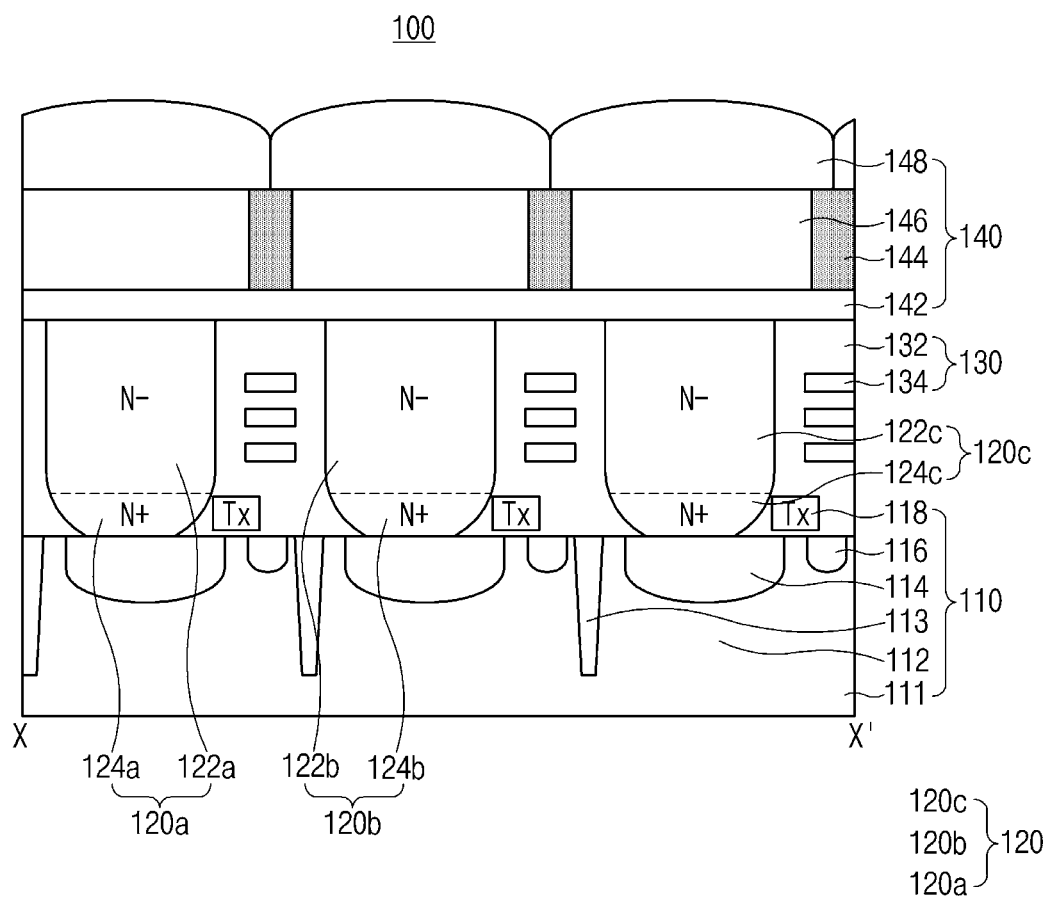
FIG. 2 is a cross-sectional view illustrating a pixel array taken along a line X-X' shown in FIG. 1.

FIG. 2 is a cross-sectional view illustrating the pixel array 100 taken along a line X-X' shown in FIG. 1.

Referring to FIG. 2, the pixel array 100 may include a lower substrate region 110, an upper substrate region 120 (including 120a, 120b, and 120c), a device isolation and line region 130, and a light transmission region 140.

The lower substrate region 110 may be coupled or bonded to the upper substrate region 120. The lower substrate region 110 may receive photocharges from the upper substrate region 120 including photoelectric conversion regions 120a, 120b, and 120c. The lower substrate region 110 may read out signals corresponding to the received photocharges to corresponding lines. The lower substrate region 110 may include a substrate 111, an active region 112, a device isolation region 113, a junction region 114, a floating diffusion (FD) region 116, and a readout circuit 118. In some implementations, the readout circuit 118 may be formed over the substrate 111 and relative to the active region 112.

The substrate 111 may include a semiconductor substrate. The semiconductor substrate may be in a monocrystalline state, and may include a silicon-containing material. Thus, the semiconductor substrate may include a monocrystalline silicon-containing material. The substrate 111 may be or include a thin film substrate that is formed as a thin film through a thinning process. For example, the substrate 111 may be or include a bulk-silicon substrate that is formed as a thin film through the thinning process. The substrate 111 may include P-type impurities.

The active region 112 may be defined by a device isolation region 113 in the substrate 111, and may include a junction region 114, a floating diffusion (FD) region 116, and a readout circuit 118 that are included in each unit pixel (PX). The active region 112 may include P-type impurities (P−).

The device isolation region 113 defining the active region 112 may include an insulation material or film (also called a dielectric material or film), for example, an oxide material or film, a nitride material or film, etc. The device isolation region 113 may include a Shallow Trench Isolation (STI) structure.

The junction region 114 may be coupled or bonded to photoelectric conversion regions 120a, 120b, and 120c of the upper substrate region 120. Since the junction region 114 is directly coupled to the photoelectric conversion regions 120a, 120b, and 120c, the junction region 114 can receive photocharges from the photoelectric conversion regions 120a, 120b, and 120c, and temporarily store the received photocharges in the junction region 114. The junction region 114 may include impurities having the same characteristics as in conductive layers 124a, 124b, and 124c of the photoelectric conversion regions 120a, 120b, and 120c. For example, the junction region 114 may include high-density N-type impurities (N+).

The floating diffusion (FD) region 116 may temporarily store photocharges received from the junction region 114 by the readout circuit 118. The floating diffusion (FD) region 116 may include an N-type impurity region.

The readout circuit 118 may transmit photocharges stored in the junction region 114 of each unit pixel (PX) to the floating diffusion (FD) region 116, may read out the photocharges, and may output a signal corresponding to the photocharges to a column line. The readout circuit 118 may include a transfer transistor (Tx) configured to transmit the photocharges stored in the junction region 114 to the floating diffusion (FD) region 116 in response to an output signal of the row driver 500. In some implementations, the readout circuit 118 may be coupled to the junction region 114 and the floating diffusion (FD) region 116.

Although only the transfer transistor (Tx) is shown in FIG. 2 for convenience of description, other implementations are also possible, and the readout circuit 118 may further include a reset transistor (Rx) configured to periodically reset charges stored in the floating diffusion (FD) region 116, a drive transistor (Dx) acting as a source follower transistor configured to buffer signals based on the charges stored in the floating diffusion (FD) region 116, and a select transistor (Sx) configured to transmit a signal (pixel value) of each unit pixel (PX) to a column line. The readout circuit 118 may be formed in regions among the photoelectric conversion regions 120a, 120b, and 120c over the substrate 111, and may be coupled to the conductive lines 134 of the device isolation and line region 130 through one or more contacts.

In some implementations, the transfer transistor (Tx) according to the embodiment may couple the junction region 114 formed in the lower substrate region 110 to the floating diffusion (FD) region 116. For example, the transfer transistor (Tx) may transmit photocharges stored in the junction region 114 to the floating diffusion (FD) region 116 in response to an output signal of the row driver 500.

The upper substrate region 120 may include a plurality of photoelectric conversion regions 120a, 120b, and 120c corresponding to the respective unit pixels. The photoelectric conversion regions 120a, 120b, and 120c may generate photocharges by converting incident light received through the light transmission region 140 into an electrical signal, and may transmit the photocharges to the junction region 114 of the lower substrate region 110. For example, the photoelectric conversion regions 120a, 120b, and 120c may extend in a direction perpendicular to the substrate 111, and bottom surfaces of the photoelectric conversion regions 120a, 120b, and 120c may be directly coupled to the junction region 114, such that the photocharges generated from the photoelectric conversion regions 120a, 120b, and 120c may be transmitted to the junction region 114 of the lower substrate region 110.

The photoelectric conversion region 120a may include a stacked structure of the photoelectric conversion layer 122a and the conductive layer 124a, the photoelectric conversion region 120b may include a stacked structure of the photoelectric conversion layer 122b and the conductive layer 124b, and the photoelectric conversion region 120c may include a stacked structure of the photoelectric conversion layer 122c and the conductive layer 124c. The photoelectric conversion regions 120a, 120b, and 120c may be buried in the insulation film 132 of the device isolation and line region 130. In some implementations, the photoelectric conversion regions 120a, 120b, and 120c may be surrounded by the insulation film 132 of the device isolation and line region 130. For example, the photoelectric conversion regions 120a, 120b, and 120c may be buried in or surrounded by the insulation film in a manner that the lower conductive layers 124a, 124b, and 124c can be directly coupled to the junction region 114.

Each of the photoelectric conversion layers 122a, 122b, and 122c may include low-density N-type impurities (N−), and may convert incident light received through the light transmission region 140 into an electrical signal, thereby generating photocharges. Each of the conductive layers 124a, 124b, and 124c may include high-density N-type impurities (N+), and may transmit photocharges generated from the photoelectric conversion layers 122a, 122b, and 122c to the junction region 114 of the lower substrate region 110.

In the disclosed technology, each of the photoelectric conversion region 120a, 120b, 120c may be designed to have a portion with a round or curved shape to improve characteristics of the image sensing device. As shown in FIG. 2, a lower edge region of each photoelectric conversion region 120a, 120b, or 120c may be formed in a round (or curved) shape. In some implementations, the side surfaces of the conductive layers 124a, 124b, 124c that are coupled to the junction region 114 are rounded or curved. Since the lower edge region of each photoelectric conversion region 120a, 120b, or 120c is formed in a round or curved shape, occurrence of crosstalk between contiguous photoelectric conversion regions can be prevented, and a dark defect caused by the increasing electric field formed by concentration of potentials generated in each edge can be prevented. In addition, if a vertical length of the photoelectric conversion region 120a, 120b, 120c is long, a movement distance of electrons moving to the junction region 114 becomes longer, such that movement capability of the electrons may be deteriorated. In this case, the lower edge portion of each photoelectric conversion regions 120a, 120b, or 120c may be formed in a round or curved shape, resulting in shortening the vertical length of the photoelectric conversion region 120a, 120b, 120c along the round or curved shape. Thus, it is possible to achieve improvements of image lag characteristics.

The device isolation and line region 130 may be formed over the lower substrate region 110 so as to gap-fill spaces among the photoelectric conversion regions 120a, 120b, and 120c, and may include an insulation material or film 132 and conductive materials or lines 134 formed in the insulation material or film 132. In this case, the insulation material or film 132 may act as a device isolation region configured to isolate each of the photoelectric conversion regions 120a, 120b, and 120c, and may also act as an interlayer insulation film configured to insulate each conductive line 134.

In some implementations, the insulation material or film 132 may include an insulation material having fluidity and porous characteristics. For example, the insulation material or film 132 may include a porous low-K dielectric film, a silicon glass, a photoresist material, and/or an organic material. Thus, when the upper substrate region 120 is bonded to the lower substrate region 110, the insulation material or film 132 which include a fluidity-containing insulation material having porous characteristics can fill spaces among the photoelectric conversion regions 120a, 120b, and 120c. For example, the insulation material or film 132 with the fluidity can be gap-filled in the spaces among the photoelectric conversion regions 120a, 120b, and 120c, and the photoelectric conversion regions 120a, 120b, and 120c can be well bonded to the junction region 114 without being detached from the junction region 114. The insulation film 132 may be formed of or include a stacked structure of a plurality of interlayer insulation materials or films.

The conductive lines 134 may include first metal lines configured to transmit signals for controlling the readout circuit 118, and second metal lines configured to read out photocharges generated from the photoelectric conversion regions 120a, 120b, and 120c. The conductive lines 134 may include at least one of aluminum (Al), copper (Cu), or tungsten (W). Thus, the conductive lines 130 may include Al, Cu, or W, or any combination of at least two of Al, Cu, or W. The conductive lines 134 may be coupled to the readout circuit 118 through one or more contacts. The conductive lines 134 may be formed in spaces between the photoelectric conversion regions 120a, 120b, and 120c.

The light transmission region 140 may allow light received from outside to reach the photoelectric conversion regions 120a, 120b, and 120c. The light transmission region 140 may include an anti-reflection film 142, a grid structure 144, a plurality of color filters 146, and a plurality of microlenses 148. The light transmission region 140 may provide an optical passage through which light incident on the light sensing device can reach the photoelectric conversion regions 120a, 120b, and 120c.

The anti-reflection film 142 may be formed not only over the photoelectric conversion regions 120a, 120b, and 120c, but also over the insulation material or film 132. The anti-reflection film 142 may planarize a specific region to be used as a formation region of the color filters 146 and the grid structure 144, and may allow incident light received through the color filters 146 to be transferred to the photoelectric conversion regions 120a, 120b, and 120c.

The grid structure 144 may be disposed between the color filters 146, and may prevent occurrence of crosstalk between the color filters 146.

The color filters 146 may include a plurality of red color filters (R), a plurality of green color filters (G), and a plurality of blue color filters (B), such that the color filters 146 may be formed to perform filtering of visible light that is outside the target pass bands of the red, green, and blue color filters such that only specific-colored light R, G, or B received through the microlenses 148 can pass through the respective color filters R, G, or B of the color filters 146. The color filters 146 may be arranged in a Bayer pattern.

The microlenses 148 may focus incident light received from outside, and may transmit the focused incident light to the color filters 146.

FIGS. 3 to 9 are cross-sectional views illustrating methods for forming the image sensing device shown in FIG. 2 based on some implementations of the disclosed technology.

Figure 3:
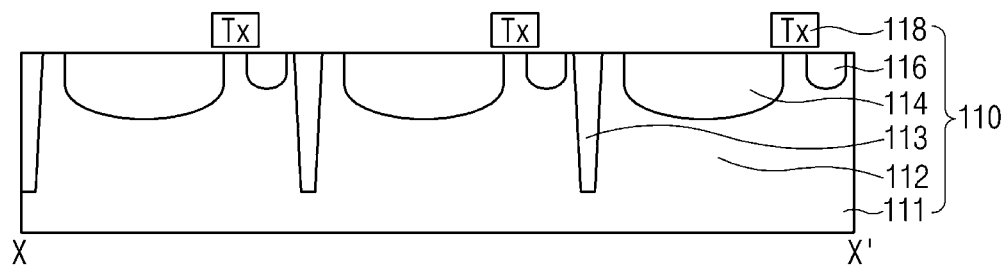
FIGS. 3 to 9 are cross-sectional views illustrating a method for forming an image sensing device shown in FIG. 2 based on some implementations of the disclosed technology.

Referring to FIG. 3, the device isolation region 113 defining the active region 112 which is to be used as a formation region of each unit pixel (PX) may be formed in the lower substrate 111. In this case, the substrate 111 may include P-type impurities (P−).

Subsequently, N-type impurities may be implanted into some regions of the active region 112, such that the junction region 114 and the floating diffusion (FD) region 116 may be formed. The junction region 114 may be directly coupled to the photoelectric conversion region of the upper substrate through a subsequent bonding process, may receive photocharges from the photoelectric conversion region, and may temporarily store the received photocharges therein. In this case, the junction region 114 may include high-density N-type impurities (N+).

The readout circuit 118 including the transfer transistor (Tx) may be formed over the active region 112. Although only the transfer transistor (Tx) is shown in FIG. 3 for convenience of description, the readout circuit 118 may further include a reset transistor, a drive transistor, and/or a select transistor.

The transfer transistor (Tx) according to the embodiment may use the junction region 114 and the floating diffusion (FD) region 116 as a source/drain region. Thus, the transfer transistor (Tx) may transmit the photocharges stored in the junction region 114 to the floating diffusion (FD) region 116 in response to an output signal of the row driver 500.

Figure 4:
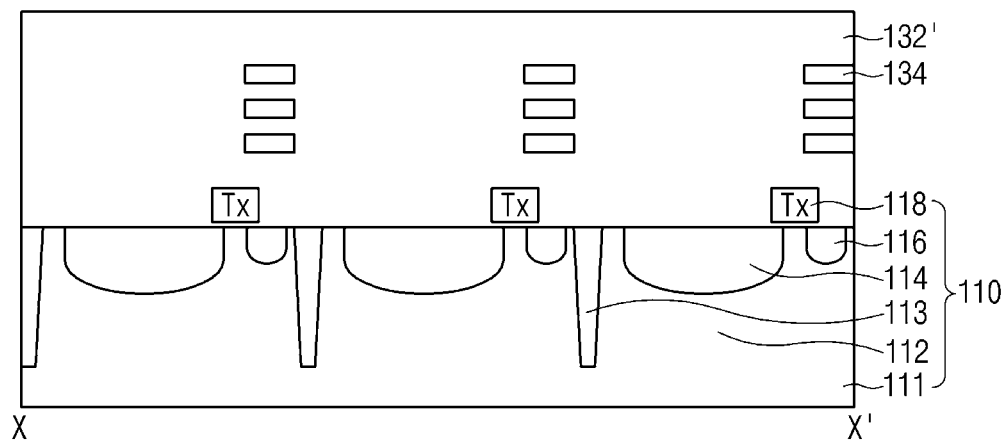

Referring to FIG. 4, the insulation film 132' including the conductive lines 134 may be formed over the lower substrate region 110 including the junction region 114, the floating diffusion (FD) region 116, and the readout circuit 118.

In this case, the insulation film 132' may include an insulation material having fluidity and porous characteristics. For example, the insulation film 132' may include a porous low-K dielectric film, a silicon glass, a photoresist material, and/or an organic material. The insulation film 132' may be formed of a stacked structure of plural interlayer insulation films.

The conductive lines 134 may include first metal lines configured to transmit signals for controlling the readout circuit 118, and second metal lines configured to transmit electrical signals generated from the photoelectric conversion regions 120a, 120b, and 120c. The conductive lines 134 may include at least one of aluminum (Al), copper (Cu), or tungsten (W). Thus, the conductive lines 134 may include Al, Cu, or W, or the combination of at least two of Al, Cu, or W. The conductive lines 134 may be coupled to the readout circuit 118 through one or more contacts.

The conductive lines 134 may be formed in spaces between the photoelectric conversion regions to be bonded in a subsequent process. In some implementations, the conductive lines 134 may be formed in a region that is not overlapped with the photoelectric conversion regions in a vertical direction. Thus, the conductive lines 134 may be formed between the photoelectric conversion regions along a horizontal direction.

Figure 5:
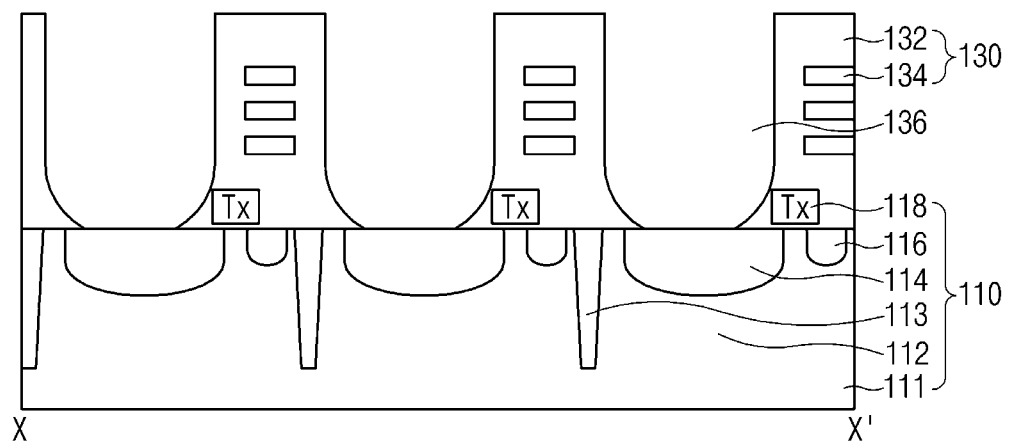

Referring to FIG. 5, a region of the insulation film 132', which is to be bonded to photoelectric conversion regions and used as a bonding region to each photoelectric conversion region, may be etched, resulting in formation of a trench 136.

For example, after a mask pattern defining the photoelectric conversion regions is formed over the insulation film 132, the insulation film 132 may be etched using the mask pattern as an etch mask, resulting in formation of the trench 136. In this case, the trench 136 may be formed to expose the junction region 114. As shown in FIG. 5, the trench 136 has a rounded or curved shape around its lower edge region.

Figure 6:
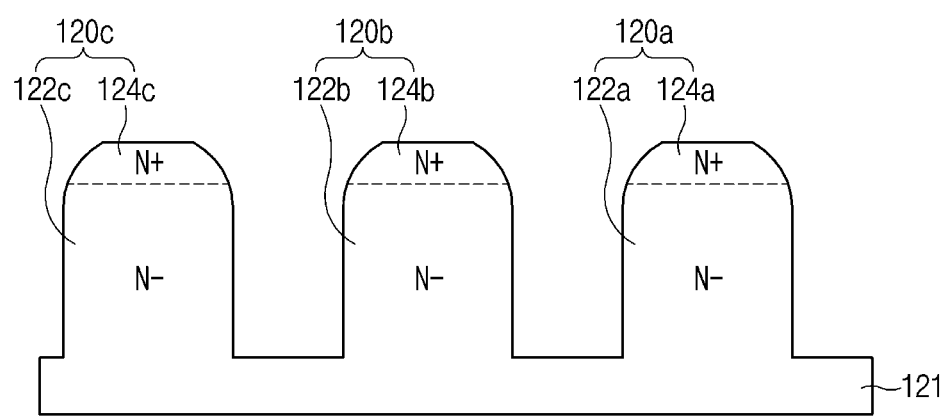

Referring to FIG. 6, an impurity structure including differently doped regions is prepared in the upper substrate 121. The impurity structure may include the low-density N-type impurity region (N−) and the high-density N-type impurity region (N+) that are stacked. The impurity structure formed in the upper substrate 121 may be etched such that the photoelectric conversion regions 120a, 120b, and 120c of the respective unit pixels (PX) may be formed. Each of the photoelectric conversion regions 120a, 120b, and 120c may be located apart from one another by the etching. For example, the upper substrate 121 may be etched from a first surface (i.e., a surface on which the high-density N-type impurity region (N+) is formed) in a direction in which the low-density N-type impurity region (N+) is formed. Each of the photoelectric conversion regions 120a, 120b, and 120c may be formed in a convex shape from a second surface of the upper substrate 121 that is opposite to the first surface of the upper substrate 121. The upper substrate 121 may include a crystalline semiconductor layer.

The photoelectric conversion region 120a may include the photoelectric conversion layer 122a and the conductive layer 124a. The photoelectric conversion region 120b may include the photoelectric conversion layer 122b and the conductive layer 124b. The photoelectric conversion region 120c may include the photoelectric conversion region 122c and the conductive layer 124c. Each of the photoelectric conversion layers 122a, 122b, and 122c may include low-density N-type impurities (N−), and each of the conductive layers 124a, 124b, and 124c may include high-density N-type impurities (N+).

In this case, an upper edge region of each photoelectric conversion region 120a, 120b, or 120c may be formed in a round or curved shape. For example, an annealing process may be performed on the upper substrate 121 in which impurities are implanted, such that a circular doping profile may be formed. Thereafter, wet etching may be performed using a difference in density between the doping profiles, such that each photoelectric conversion region 120a, 120b, or 120c having one or more round or curved edges may be formed.

Figure 7:
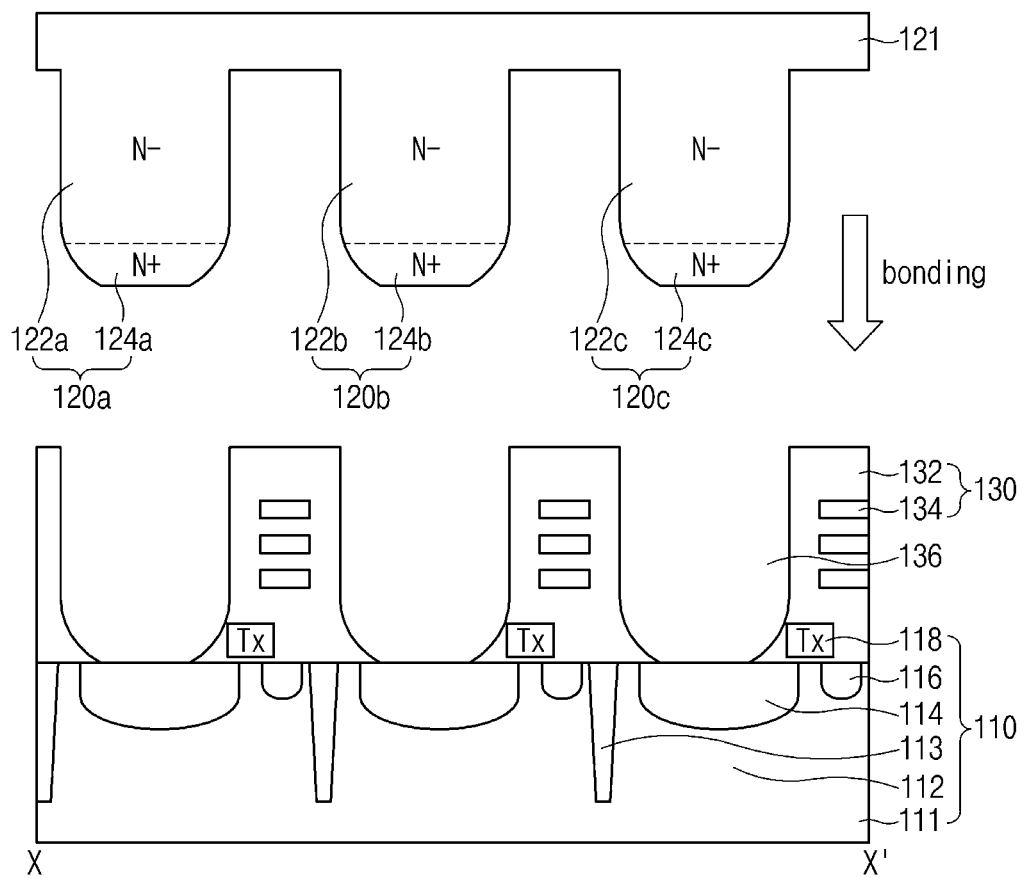

FIG. 7 shows a process in which the upper substrate 121 including photoelectric conversion regions 120a, 120b, and 120c is bonded to the lower substrate 111. The upper substrate 121 in which the photoelectric conversion regions 120a, 120b, and 120c are formed is turned over such that the photoelectric conversion regions 120a, 120b, and 120c are arranged to face corresponding trenches 130. For example, the lower substrate 111 and the upper substrate 121 may be arranged in a manner that the photoelectric conversion regions 120a, 120b, and 120c are arranged to correspond to the trench 136.

Subsequently, the upper substrate 121 may be bonded to the lower substrate 111 in a manner that the photoelectric conversion regions 120a, 120b, and 120c are inserted into the trench 136, such that the conductive layers 124a, 124b, and 124c of the photoelectric conversion regions 120a, 120b, and 120c can be directly coupled to the junction region 114.

As a pixel size of the image sensing device gradually reduced, in order to guarantee a sufficient capacitance of each pixel, it is necessary for each photoelectric conversion element to be elongated in length. However, as the length of the photoelectric conversion element increases, there were some limitations in the conventional art to isolate between the photoelectric conversion elements with insulation materials. For example, in the case of forming a Deep Trench Isolation (DTI) film using the conventional technologies in which the substrate is etched to form the trenches and the trench is gap-filled with an insulation material, the trenches tend to be insufficiently gap-filled with the insulation material. In this case, there was a high possibility that dark characteristics and the crosstalk deterioration of the image sensing device occur.

Therefore, some implementations of the disclosed technology suggest forming the photoelectric conversion regions 120a, 120b, and 120c separately and placing the separately prepared photoelectric conversion regions 120a, 120b, and 120c in the trenches formed in the insulation material. As shown in FIGS. 6 and 7, the photoelectric conversion regions 120a, 120b, and 120c are separately formed and the photoelectric conversion regions 120a, 120b, and 120c are placed or inserted into the trench 136. Since the trench is formed in the fluidity-containing insulation film 132, the photoelectric conversion regions 120a, 120b, and 120c can be bonded to the trench 136. As a result, even when a length of each of the photoelectric conversion regions 120a, 120b, and 120c increases, spaces between the photoelectric conversion regions 120a, 120b, and 120c can be sufficiently filled with the insulation film 132.

Thus, the insulation film 132 according to the embodiment of the disclosed technology may also be used as a device isolation region of each photoelectric conversion region 120a, 120b, or 120c.

Figure 8:
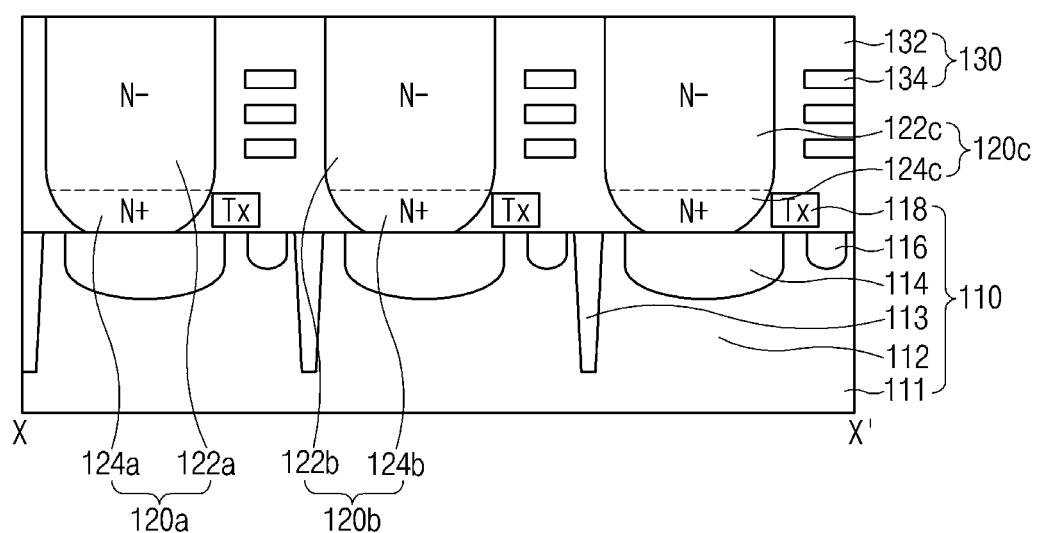

Referring to FIG. 8, a back surface of the upper substrate 121 may be etched and planarized until the insulation film 132 is exposed, such that the photoelectric conversion regions 120a, 120b, and 120c can be isolated from one another.

Figure 9:
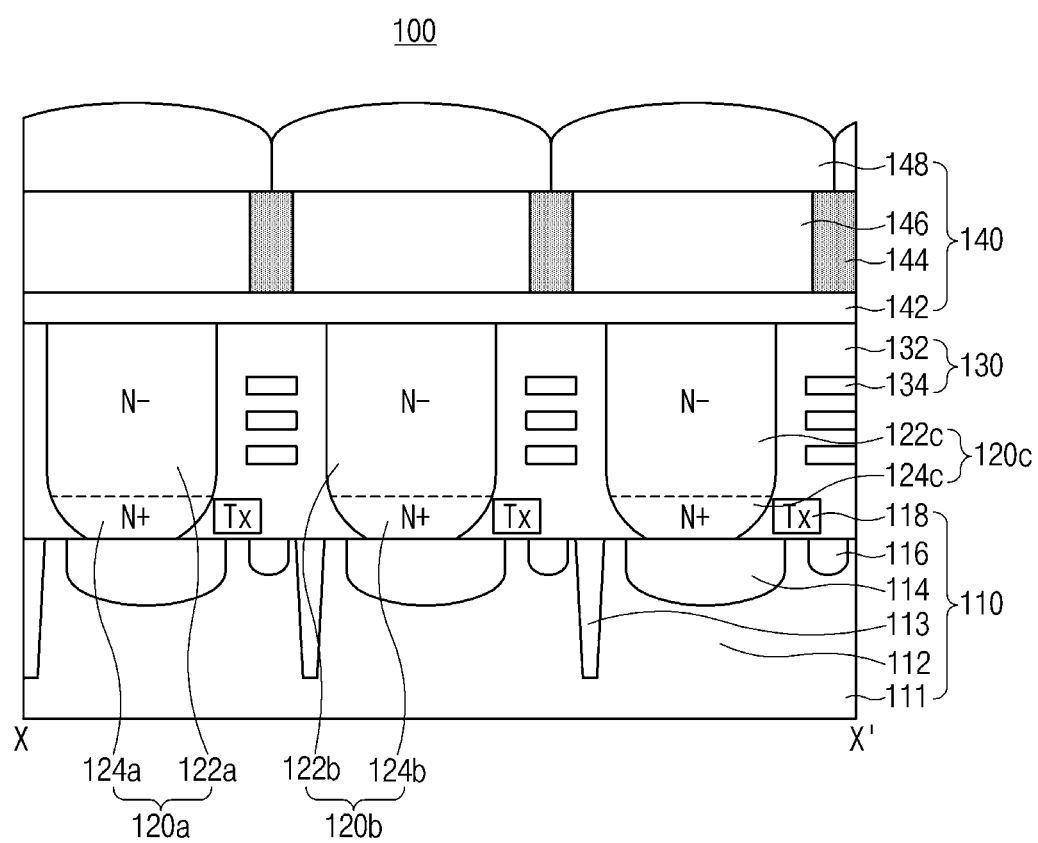

Referring to FIG. 9, the anti-reflection film 142 may be formed not only over the photoelectric conversion regions 120a, 120b, and 120c, but also over the insulation film 132.

Subsequently, after the grid structure 144 and the color filters 146 are formed over the anti-reflection film 142, the microlenses 148 may be formed over the color filters 146.

Figure 10:
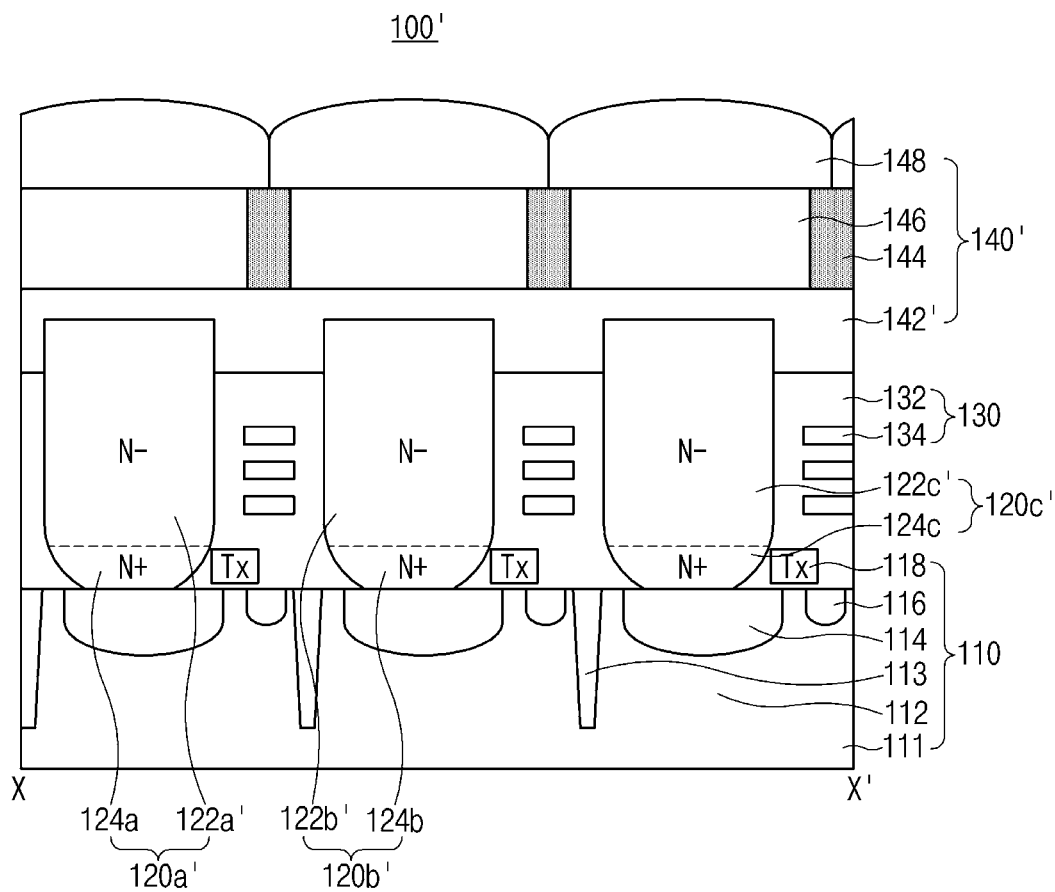
FIG. 10 is a cross-sectional view illustrating an image sensing device based on some implementations of the disclosed technology.

FIG. 10 is a cross-sectional view illustrating an image sensing device 100' according to another embodiment of the disclosed technology.

Referring to FIG. 10, unlike the image sensing device 100 of FIG. 2, the image sensing device 100' may include a plurality of photoelectric conversion regions 120a', 120b', and 120c' longer in length than the photoelectric conversion regions 120a, 120b, and 120c of FIG. 2. For example, the photoelectric conversion regions 120a', 120b', 120c' may be formed in a manner that an upper region of each photoelectric conversion layer 122a', 122b', or 122c' is formed to protrude from the top surface of the insulation film 132.

The photoelectric conversion regions 120a', 120b', and 120c' shown in FIG. 10 may have higher Linear Well Capacitance (LWC) than the photoelectric conversion regions 120a, 120b, and 120c shown in FIG. 2.

In this case, the anti-reflection film 142' may be formed over the photoelectric conversion regions 120a', 120b', and 120c' and the insulation film 132 such that the anti-reflection film 142' may cover the protrusion regions of the photoelectric conversion layers 122a', 122b', and 122c'.

In the fabrication process of FIG. 8, the back surface of the upper substrate 121 is not etched to be overall planarized, and only a specific region formed to overlap with the insulation film 132 in the upper substrate 121 is selectively etched using the mask pattern defining the photoelectric conversion regions, such that the above-mentioned structure can be formed.

Figure 11:
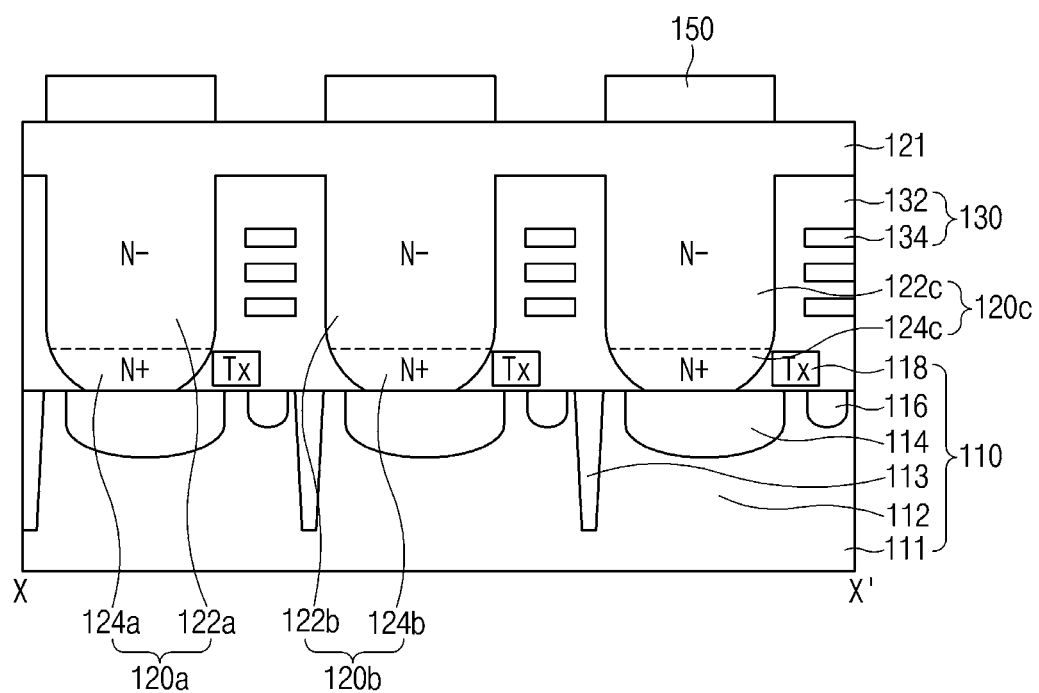
FIGS. 11 to 13 are cross-sectional views illustrating a method for forming an image sensing device shown in FIG. 10 based on some implementations of the disclosed technology.
Figure 12:
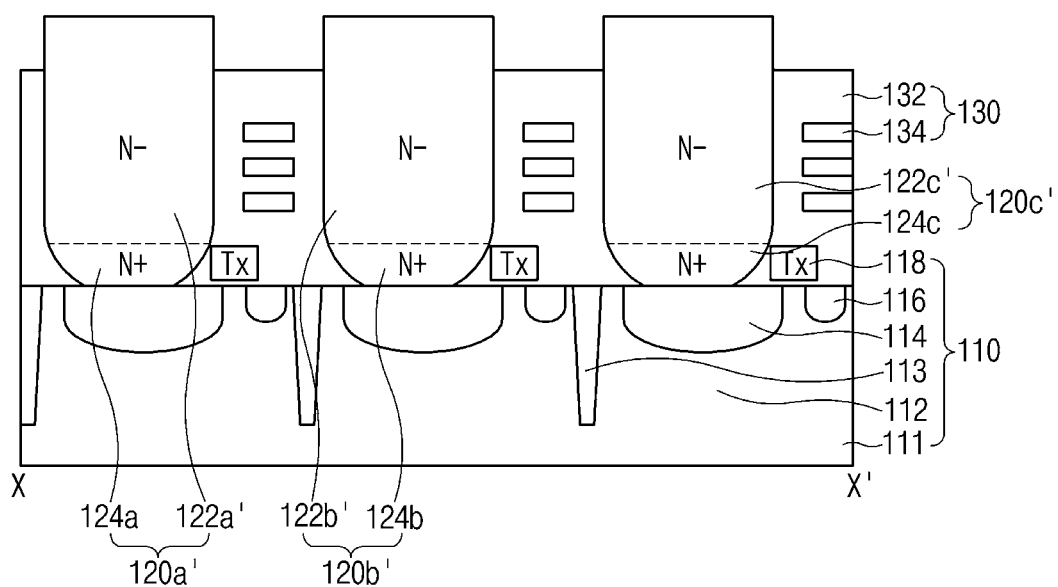
Figure 13:
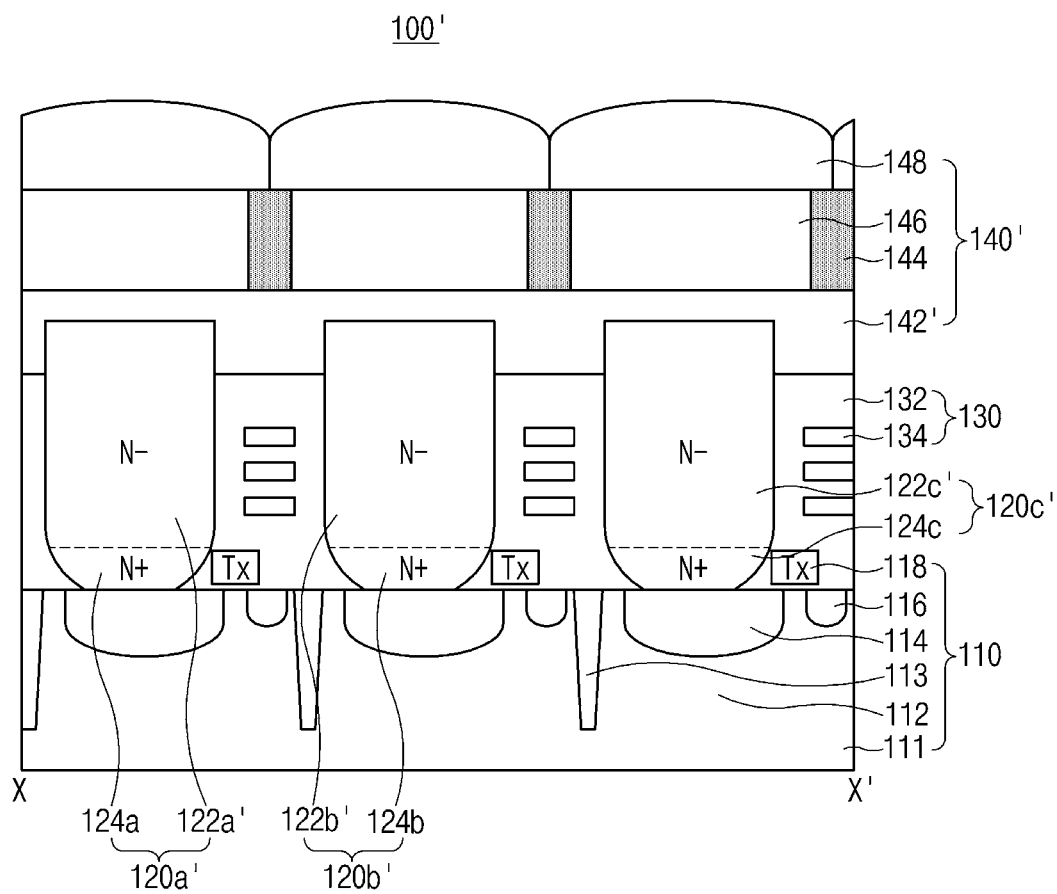

FIGS. 11 to 13 are cross-sectional views illustrating methods for forming the image sensing device 100' shown in FIG. 10 according to another embodiment of the present disclosure.

Referring to FIGS. 11 to 13, the upper substrate 121 may be pressed and bonded to the lower substrate 111 through the above-mentioned fabrication processes of FIGS. 3 to 7.

Referring to FIG. 11, a mask pattern 150 defining the photoelectric conversion regions may be formed at a back surface of the upper substrate 121.

The mask pattern 150 may include a photoresist pattern therein.

Referring to FIG. 12, after the upper substrate 121 is selectively etched using the mask pattern 150 as an etch mask until the insulation film 132 is exposed, the mask pattern 150 is then removed.

Referring to FIG. 13, the anti-reflection film 142' may be formed not only over the photoelectric conversion regions 120a', 120b', and 120c', but also over the insulation film 132.

Subsequently, after the grid structure 144 and the color filters 146 are formed over the anti-reflection film 142', the microlenses 148 may be formed over the color filters 146.

As is apparent from the above description, the embodiments of the disclosed technology can improve optical characteristics and crosstalk characteristics of the image sensing device.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, those skilled in the art will understand that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the disclosed technology. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An image sensing device comprising:
   a semiconductor substrate including an active region;
   a first impurity region and a second impurity region formed in the active region;
   a photoelectric conversion region disposed over the semiconductor substrate to be directly coupled to the first impurity region and configured to generate photocharges in response to incident light and transmit the generated photocharges to the first impurity region;
   a switching element disposed coupled to the first impurity region and the second impurity region and configured to transmit the photocharges stored in the first impurity region to the second impurity region;
   an insulation structure disposed on sides of the photoelectric conversion region; and
   a plurality of conductive lines disposed in the insulation structure and configured to read out an electrical image signal corresponding to the photocharges generated by the photoelectric conversion region.

2. The image sensing device according to claim 1, further comprising:
   a light transmission region formed over the photoelectric conversion region and the insulation structure, and configured to receive the incident light and transmit the received incident light to the photoelectric conversion region.

3. The image sensing device according to claim 1, wherein the photoelectric conversion region has a round edge portion.

4. The image sensing device according to claim 1, wherein the photoelectric conversion region includes:
   a photoelectric conversion layer configured to convert the incident light into an electrical signal and generate the photocharges; and
   a conductive layer disposed under the photoelectric conversion layer and bonded to the first impurity region and configured to transmit the photocharges generated from the photoelectric conversion layer to the first impurity region.

5. The image sensing device according to claim 4, wherein:
   the photoelectric conversion layer including low-density N-type impurities (N−); and
   the conductive layer including high-density N-type impurities (N+).

6. The image sensing device according to claim 4, wherein the first impurity region includes impurities having a same polarity as those of the conductive layer.

7. The image sensing device according to claim 1, wherein the insulation structure includes a material which is porous and has a fluidity.

8. The image sensing device according to claim 1, wherein the photoelectric conversion region is bonded to the first impurity region.

9. The image sensing device according to claim 1, wherein the photoelectric conversion region has a top surface protruding from a top surface of the insulation structure.

* * * * *